United States Patent
Zou et al.

(10) Patent No.: US 12,137,504 B2
(45) Date of Patent: Nov. 5, 2024

(54) IDENTIFICATION CIRCUIT AND METHOD FOR POWER-LINE CARRIER SIGNAL, AND INTEGRATED CIRCUIT CHIP

(71) Applicant: CR TECHNOLOGY (PINGTAN) CO., LTD., Fujian (CN)

(72) Inventors: Yungen Zou, Fujian (CN); Yuling Lu, Fujian (CN); Shicheng Qiao, Fujian (CN); Ronghuai Cai, Fujian (CN); Mengbang Chen, Fujian (CN); Dandan Zhang, Fujian (CN); Jinwei Cao, Fujian (CN)

(73) Assignee: CR TECHNOLOGY (PINGTAN) CO., LTD., Fujian (CN)

( * ) Notice: Subject to any disclaimer, the term of this patent is extended or adjusted under 35 U.S.C. 154(b) by 105 days.

(21) Appl. No.: 17/789,062

(22) PCT Filed: Dec. 31, 2019

(86) PCT No.: PCT/CN2019/130874
§ 371 (c)(1),
(2) Date: Jun. 24, 2022

(87) PCT Pub. No.: WO2021/134653
PCT Pub. Date: Jul. 8, 2021

(65) Prior Publication Data
US 2023/0049359 A1    Feb. 16, 2023

(51) Int. Cl.
*H05B 45/30*        (2020.01)
*H05B 45/355*       (2020.01)
(Continued)

(52) U.S. Cl.
CPC .......... *H05B 45/50* (2020.01); *H05B 45/355* (2020.01); *H05B 47/185* (2020.01); *G01R 19/2503* (2013.01); *G01R 19/2513* (2013.01)

(58) Field of Classification Search
CPC .... H05B 45/50; H05B 45/345; H05B 45/355; H05B 47/184; H05B 47/185; G01R 19/2503; G01R 19/2513; G01R 19/16519
See application file for complete search history.

(56) References Cited

U.S. PATENT DOCUMENTS 9,171,491 B1 * 10/2015 Kwon .................. G09G 3/2003
9,949,328 B1 *  4/2018 Fong ...................... H05B 45/10
(Continued)

FOREIGN PATENT DOCUMENTS

CN        1886018 A     12/2006
CN      103763833 A      4/2014
(Continued)

OTHER PUBLICATIONS

International Search Report for International Application No. PCT/CN2019/130874; Date of Completion: Sep. 8, 2020; Date of Mailing: Sep. 28, 2020; 3 Pages.
(Continued)

*Primary Examiner* — Tung X Le
(74) *Attorney, Agent, or Firm* — CANTOR COLBURN LLP

(57) ABSTRACT

The present application discloses an identification circuit for a power-line carrier signal. During signal transmission on a power line, the amplitude change and duration of a voltage signal on the power line are identified and then decoded into corresponding data, so as to reduce dependency on a power supply voltage during signal identification, and prevent the signal identification rate from decreasing as a result of an increase in the transmission distance, thereby reducing requirements for a system power supply.

17 Claims, 4 Drawing Sheets

(51) Int. Cl.
*H05B 45/50* (2022.01)
*H05B 47/185* (2020.01)
*G01R 19/25* (2006.01)

(56) References Cited

U.S. PATENT DOCUMENTS

| | | | |
|---|---|---|---|
| 2006/0033485 A1 | 2/2006 | Konopka | |
| 2011/0121748 A1* | 5/2011 | Kuo | H03M 7/006 341/899 |
| 2013/0342122 A1* | 12/2013 | Sawada | H03K 17/51 327/109 |
| 2015/0237694 A1* | 8/2015 | Zudrell-Koch | H05B 39/044 315/307 |
| 2017/0366094 A1* | 12/2017 | Sugawara | H02M 3/33546 |
| 2019/0037660 A1* | 1/2019 | Rucker | H05B 47/16 |
| 2021/0227154 A1* | 7/2021 | Muto | H04N 5/32 |

FOREIGN PATENT DOCUMENTS

| | | |
|---|---|---|
| CN | 205029951 U | 2/2016 |
| CN | 107507561 A | 12/2017 |
| CN | 108463027 A | 8/2018 |
| CN | 109600151 A | 4/2019 |
| CN | 209419485 U | 9/2019 |
| JP | 2009094961 A | 4/2009 |
| WO | 9706655 A1 | 2/1997 |
| WO | 9919808 A1 | 4/1999 |

OTHER PUBLICATIONS

Translation of International Search Report for International Application No. PCT/CN2019/130874; Date of Completion: Sep. 8, 2020; Date of Mailing: Sep. 28, 2020; 2 Pages.

Written Opinion for International Application No. PCT/CN2019/130874; Date of Completion: Sep. 23, 2020; Date of Mailing: Sep. 28, 2020; 3 Pages.

* cited by examiner

| detecting voltage amplitude variation on the power line caused by modulation of data of each of data frames on the power line in a form of a carrier signal as well as duration time, and generating a corresponding level signal | — S110 |

↓

| converting the level signal to obtain data of a current data frame | — S120 |

IDENTIFICATION CIRCUIT AND METHOD FOR POWER-LINE CARRIER SIGNAL, AND INTEGRATED CIRCUIT CHIP

CROSS REFERENCE TO RELATED APPLICATION

The present application is a National Stage of PCT Application No. PCT/CN2019/130874 filed on Dec. 31, 2019, the content of which is incorporated herein by reference thereto.

BACKGROUND

Technical Field

The present application involves in the technical field of electronic circuits, and particularly relates to an identification circuit for power-line carrier signal, an identification method for power-line carrier signal and an integrated circuit chip.

Description of Related Art

The statements herein merely provide background information related to the present application and do not necessarily constitute prior art. Nowadays, there are many power-line carrier LED control chips on the market that are applied in 3D lights, Christmas lights, curtain lights and other occasions, which simplify the installation process and greatly save the cable cost compared with previous four-wire transmission systems, meanwhile reduce the failure rate of products, thereby making no maintenance trouble. However, since these products use power lines to transmit data, a voltage of a power supply will decrease with increase of a transmission distance and signal transmission amplitude will also become smaller under a premise that the power lines themselves provide great interference. By using a fixed comparison point to identify the data, chip data recognition will fail and reliability is low when a low-level point or a high-level point is close to the fixed comparison point, which leads to that a chip relatively far from a main control is not capable of recognizing data sent by a control system and cannot respond correctly based on the system data.

BRIEF SUMMARY

A purpose of the present application is to provide an identification circuit for power-line carrier signals, an identification method for power-line carrier signals and an integrated circuit chip, which aim to solve the problem of low data identification reliability of traditional power-line carriers in a way of using a fixed comparison point.

In order to solve the above technical problem, technical solutions adopted by embodiments of the present application are as follows.

A first aspect of embodiments of the present application provides an identification circuit for power-line carrier signals, which includes:

a voltage amplitude detection circuit arranged to connect with a power line and configured to: detect voltage amplitude variation on the power line caused by modulation of data of each of data frames on the power line in a form of a carrier signal as well as duration time, and generate a corresponding level signal;

a decoding circuit connected to the voltage amplitude detection circuit and configured to convert the level signal to obtain data of a current data frame.

A second aspect of embodiments of the present application provides an identification method for power-line carrier signals, which includes:

detecting voltage amplitude variation on the power line caused by modulation of data of each of data frames on the power line in a form of a carrier signal as well as duration time, and generating a corresponding level signal;

converting the level signal to obtain data of a current data frame.

A third aspect of embodiments of the present application provides an integrated circuit chip, which includes the identification circuit for power-line carrier signals as described above.

A fourth aspect of embodiments of the present application provides an integrated circuit chip, which includes a memory, a processor, and a computer program stored in the memory and executable on the processor, the processor, when executing the computer program, implements steps of the above-mentioned method.

The beneficial effect of the identification circuit and method for power-line carrier signals provided by the embodiments of the present application lies in that: when the signal is transmitted on the power line, the amplitude change and duration time of the voltage signal on the power line are identified and then decoded into corresponding data, voltage dependency on the power supply during signal identification is reduced, and the increase in transmission distance will not reduce the signal recognition rate, thereby reducing requirements for the power supply of the system.

BRIEF DESCRIPTION OF THE DRAWINGS

In order to illustrate the technical solutions in the embodiments of the present application more clearly, the accompanying drawings that are used in description for the embodiments or exemplary technologies are briefly introduced below. Obviously, the drawings in the following description are only some embodiments of the present application, and other drawings may also be obtained for those of ordinary skill in the art according to these drawings without any creative effort.

DETAILED DESCRIPTION OF THE EMBODIMENTS

In order to make the purpose, technical solutions and advantages of the present application more clear and comprehensible, the present application will be described in further detail below with reference to the accompanying drawings and embodiments. It should be understood that the specific embodiments described herein are only used to explain the present application, but not to limit the present application.

In order to make the technical problem to be solved by the present application, technical solutions and beneficial effect more clear and comprehensible, the present application will be described in further detail below with reference to the accompanying drawings and embodiments. It should be understood that the specific embodiments described herein are only used to explain the present application, but not to limit the present application.

It should be noted that when an element is referred to as being "fixed to" or "disposed on" another element, this element may be directly or indirectly on the another element. When an element is referred to as being "connected to" another element, this element may be directly or indirectly connected to the another element.

Additionally, the terms "first" and "second" are only used for a descriptive purpose, and cannot be construed as indicating or implying relative importance or implicitly implying the number of a specified technical feature. Thus, a feature defined with "first" or "second" may expressly or implicitly include one or more of this feature. In the description of the present application, "plurality" means two or more, unless otherwise expressly and specifically defined.

Figure 1:
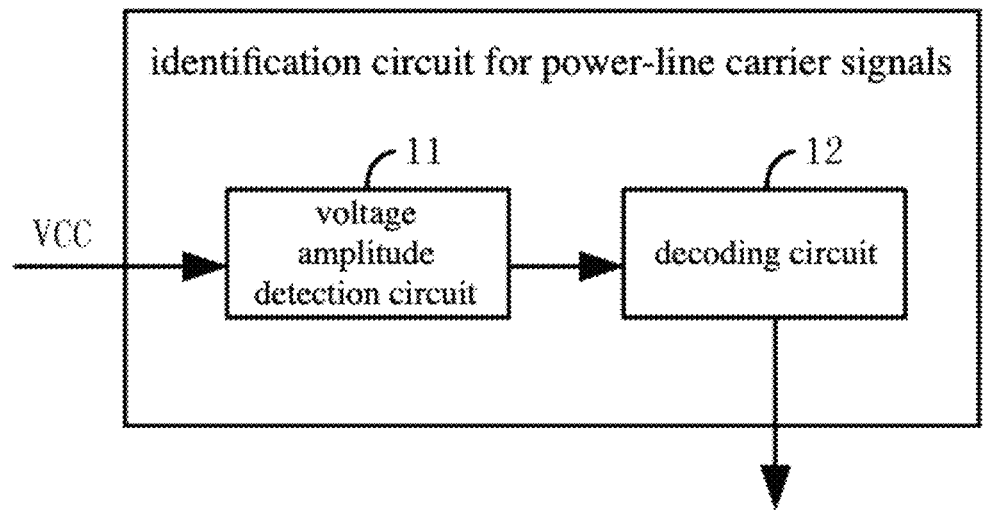
FIG. 1 is a schematic structural diagram of an identification circuit for power-line carrier signals provided by a first embodiment of the present application.

Please refer to FIG. 1, FIG. 1 shows a schematic structural diagram of an identification circuit for power-line carrier signals provided by a preferred embodiment of the present application. For convenience of description, only the part related to this embodiment is shown, and the details are as follows.

The identification circuit for power-line carrier signals in this embodiment may be integrated in a chip, for example, to drive a LED light provided with full RGB colors, and the LED light may also be integrated in the chip. The identification circuit for power-line carrier signals includes a voltage amplitude detection circuit 11 and a decoding circuit 12. A control system modulates a data signal onto a power line, and the voltage amplitude detection circuit 11 is arranged to connect with the power line and is configured to detect voltage amplitude variation on the power line caused by modulation of data of each of data frames on the power line in a form of a carrier signal as well as duration time, and generate a corresponding level signal; the decoding circuit 12 is connected to the voltage amplitude detection circuit 11 and is configured to convert the level signal to obtain data of a current data frame.

The voltage amplitude detection circuit 11 performs level conversion on a voltage variation amplitude on the power line and compares it with a reference voltage to obtain a level signal that the decoding circuit 12 is capable of identifying. The decoding circuit 12 uses a system clock to convert the level signal into carrier data; so far, a data signal loaded on the power supply voltage is decoded and separated to obtain carrier data.

When the carrier signal is transmitted on the power line, the amplitude variation and duration time of the voltage signal on the power line are identified and then decoded into corresponding data, which reduces dependence on the power supply voltage during signal identification, and will not reduce a signal identification rate with increase of the transmission distance, thereby reducing requirements of the power supply of the system.

Figure 2:
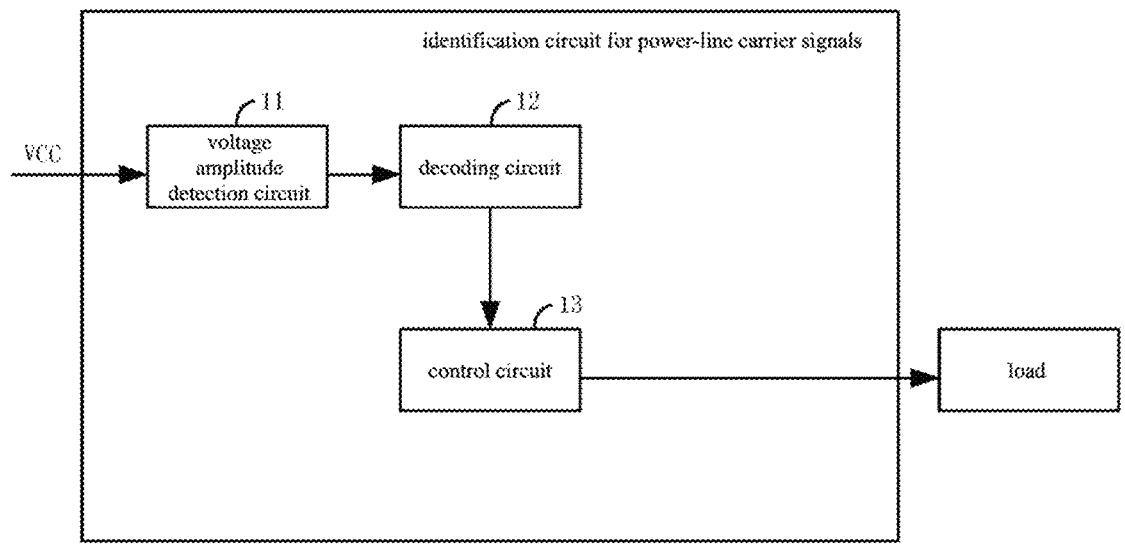
FIG. 2 is a schematic structural diagram of an identification circuit for power-line carrier signals provided by a second embodiment of the present application.

In some of the embodiments, please refer to FIG. 2, if a load needs to be driven according to the carrier data, then a control circuit 13 needs to be further configured in the circuit. The control circuit 13 is connected to the decoding circuit 12, and the control circuit 13 is configured to extract a driving signal from the data of the current data frame to drive a load. Further, the voltage amplitude detection circuit 11 further needs to perform counting and statistics according to a preset identification code (such as a RESET code) in the data of the current data frame when the control system needs to control multiple chips at the same time, and the driving signal is extracted from the data of the current data frame when the control circuit 13 determines that a chip address matches a count value of the current data frame.

Figure 3:
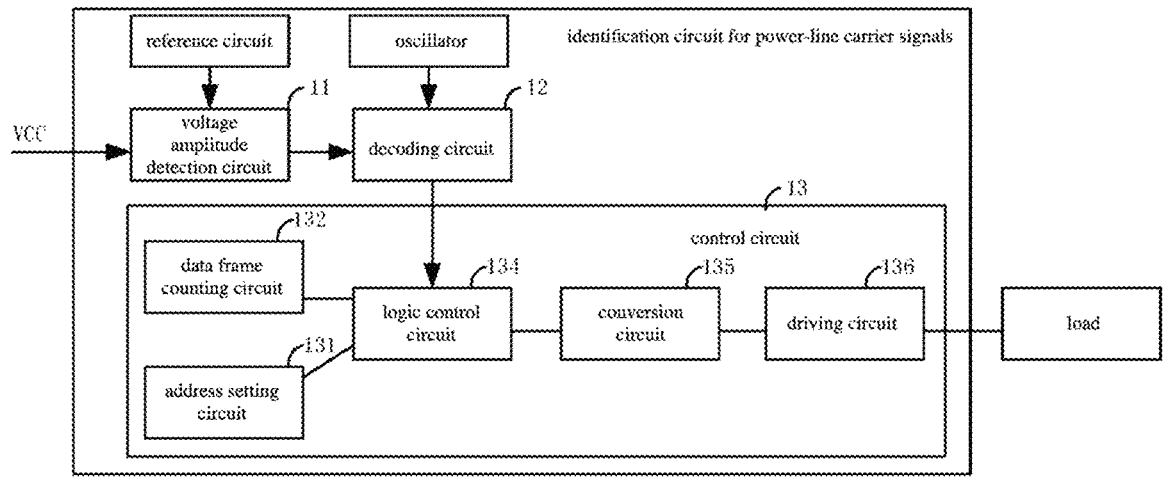
FIG. 3 is a schematic structural diagram of an identification circuit for power-line carrier signals provided by a third embodiment of the present application.

In some embodiments, please refer to FIG. 3, the control circuit 13 includes an address setting circuit 131, a data frame counting circuit 132 and a logic control circuit 134. The address setting circuit 131 is configured to set address information; the data frame counting circuit 132 is configured to perform counting and statistics according to the preset identification code in the data; the logic control circuit 134 is connected to the address setting circuit 131, the data frame counting circuit 132 and the load, and is configured to compare the address information with the count value of the current data frame, and extract the driving signal from the data of the current data frame to drive the load when the address information matches the count value.

In this embodiment, the address setting circuit 131 is connected to the logic control circuit 134, and receives an address setting control signal through the power line to burn polysilicon fuse to set the address information of the chip. In this embodiment, an address setting terminal is 9 bits. The data frame counting circuit 132 counts the preset identification code of the carrier data, and a value of the data frame counter is incremented by one when it is determined that one data frame is completed. Optionally, the data frame counting circuit 132 is further configured to receive an initial value setting instruction and set an initial value of the count value of a data frame counting register according to the initial value setting instruction, and the count value is accumulated after the circuit works normally.

As mentioned above, for example, if the load is a full-color LED light, the control circuit 13 should further include a conversion circuit 135 and a driving circuit 136, the conversion circuit 135 converts control data in the carrier data into a driving signals provided with different duty ratios, and the driving circuit 135 is connected to an external LED driving terminal and configured to drive the LED module to work according to the driving signals.

In this embodiment, the voltage amplitude detection circuit 11 determines whether there is a valid carrier signal according to a peak-to-peak value of a voltage on the power line and a duration time of the peak-to-peak value greater than a preset value. There is no need to set the method of adopting a fixed point to identify data, the peak-to-peak value of the voltage will not change even if the power supply voltage will decrease with the increase of transmission distance, and the carrier signal can be identified as long as the peak-to-peak value of the voltage on the power line is greater than the preset value, therefore high reliability is provided, and the chip relatively far from the main control can also identify the data sent by the control system.

Figure 4:
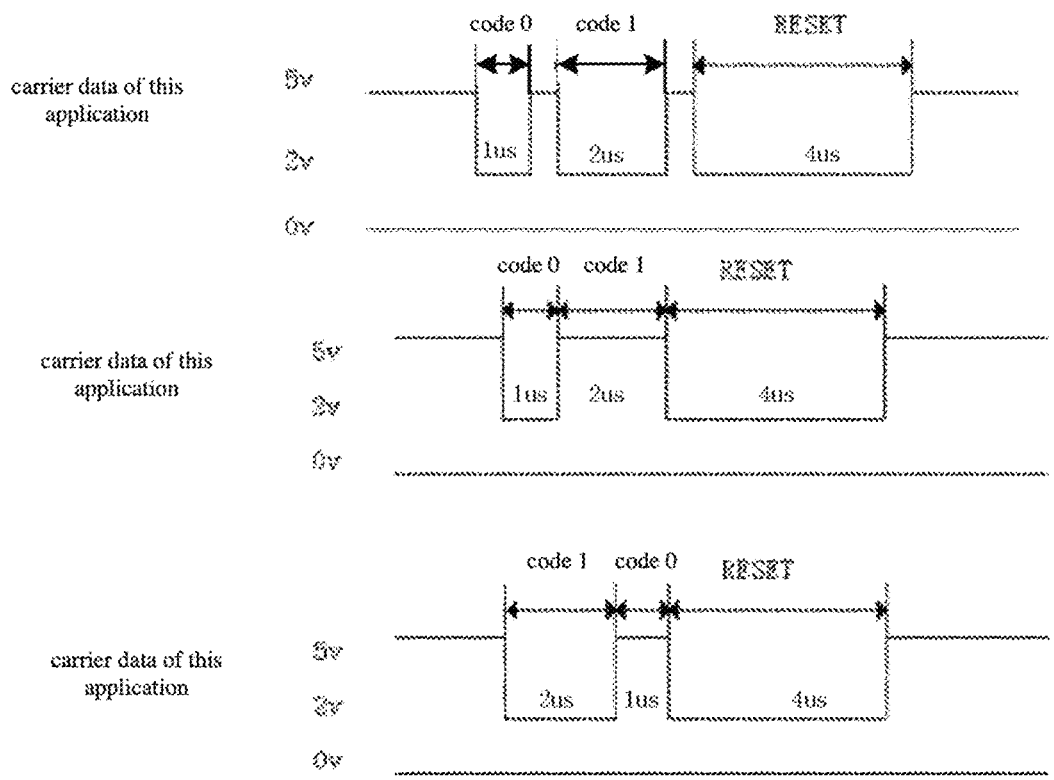
FIG. 4 is a waveform diagram of three different modes of power-line carrier signals of the present application.

Please refer to FIG. 3 and FIG. 4, specifically, the voltage on the power line is detected, and a corresponding level signal is output according to the peak-to-peak value of the voltage and the duration time of the peak-to-peak value greater than the preset value. Here, a first level signal lasting a second preset duration time is output if the peak-to-peak value of the voltage is greater than the preset value and the duration time matches a first preset duration time, a second level signal opposite to the level signal and lasting a fourth preset duration time is output if the peak-to-peak value is greater than the preset value and the duration time matches a third preset duration time, and an identification level lasting a sixth preset duration time is output if the peak-to-peak value of the voltage is greater than the preset value and the duration time matches a fifth preset duration time, the identification level is a first level signal or a second level signal. After that, the decoding circuit 12 converts the first level signal lasting the second preset duration time and the second level signal lasting the fourth preset duration time into data, i.e., 0 and 1, respectively, and converts the identification level lasting the sixth preset duration time into a preset identification code. It could be understood that, the first preset duration time and the second preset duration time may be equal or may be not equal; similarly, the third preset duration time and the fourth preset duration time may be equal or may be not equal, and the fifth preset duration time and the sixth preset duration time may be equal or may be not equal.

Please refer to FIG. 4, for example, when the peak-to-peak value of the voltage (which may be at any level) of the voltage signal accessed in by the voltage amplitude detection circuit 11 and meeting a condition lasts 1 us, then a low level lasting 1 us is output, and then the decoding circuit 12 converts the low level lasting 1 us into data 0; when it lasts 2 us, then a high level lasting 2 us is output, and the decoding circuit 12 converts the high level lasting 2 us into data 1; when it lasts 4 us, a low level or high level lasting a preset duration time (for example, 4 us) is output, and the decoding circuit 12 converts the low level or high level lasting the preset duration time into a RESET code, here the RESET code indicates that sending of this data frame is completed, and the chip whose address matches the data frame on the multi-chip cascade system will refresh brightness display.

In one embodiment, the data of each data frame on the power line is represented by a combination of a high voltage and a low voltage lasting different duration times, and the data of each data frame on the power line includes a control code, control data (for example, first data, second data, third data respectively driving a LED having three colors), and a RESET code. Optionally, the control code includes selection bits of two working modes, the first data, the second data and the third data include eight bits respectively which indicates different brightness of the LED, the RESET code is a preset identification code which represents data frame ending information, and the frame ending information is represented by the duration time of the low voltage within a set time range. An internal address of the chip is not limited to laser fuse, metal fuse, poly fuse, otp, mtp, etc.

In one embodiment, the data of each data frame on the power line is separated from the power supply voltage. For example, the working mode control code includes two bits, when the selection bit of the working mode control code is 11, the identification circuit for power-line carrier signals is switched into a working mode configured to count data frames, and the data frame counting circuit 132 is ready to receive the initial value setting instruction to set the initial value of the count value of the data frame counter. When the selection bit of the working mode control code is 01, the address information of the logic control circuit 134 and the address setting circuit 131 is compared with the count value of the data frame counting circuit 132, and when the data is the same, the logic control circuit 134 extracts control data from the data of the current data frame, the conversion circuit 135 converts the control data into brightness driving signals provided with different duty ratios, and the driving circuit 136 drives the LED modules to work according to the brightness driving signals provided with different duty ratios.

A chip address is not included when the control system sends the data frames, the data frame counting circuit 132 counts the RESET code in the decoded carrier data on the power line, and sends out an output signal after automatically matching an internal address of the chip, so that the amount of data being sent is reduced and the bit error rate of the data received by the chip is reduced, thereby making the control of the whole system more stable and reducing the cost of the chip and the control system at the same time.

Figures 5, 6:
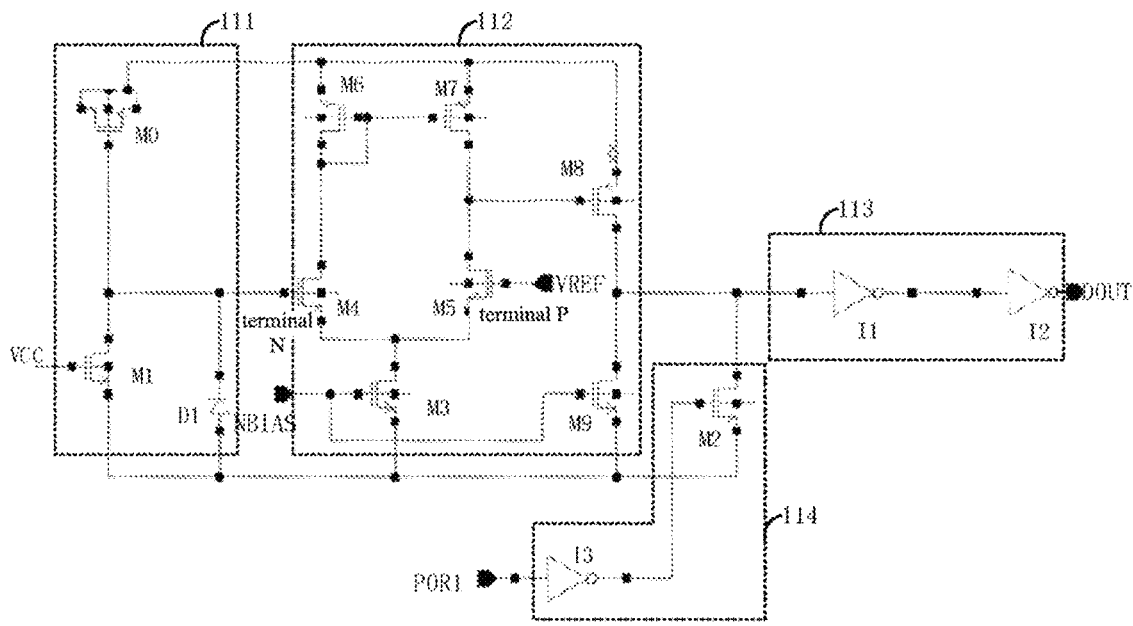
FIG. 5 is a schematic diagram of an example circuit of a voltage amplitude detection circuit in the identification circuit for power-line carrier signals as shown in FIG. 1.
FIG. 6 is a specific flowchart of an identification circuit for power-line carrier signals provided by the first embodiment of the present application.

In one embodiment, please refer to FIG. 5, the voltage amplitude detection circuit 11 includes a level conversion unit 111 and a comparator 112. The level conversion unit 111 is configured to connect with the power line to access the voltage signal on the power line, and is configured to generate a preset amplitude detection level according to the voltage signal; one input terminal of the comparator 112 is connected to the detection level, and another input terminal is connected to a reference voltage, and the comparator 112 compares the detection level with the reference voltage and outputs a comparison result of the level signal. The above-mentioned voltage amplitude detection circuit 11 provides a way of identifying carrier signals, and the level signal that can be subsequently identified by the decoding circuit 12 is obtained after level conversion and comparison.

In one embodiment, the level conversion unit 111 includes a capacitive unit M0, a first NMOS transistor M1 and a diode D1; a gate of the first NMOS transistor M1 is used to connect to the power line, a drain of the first NMOS transistor M1 is used as an output of the level conversion unit 111 and is connected to a first terminal of the capacitive unit M0, a second terminal of the capacitive unit M0 is connected to a power terminal of the comparator 112, and a source of the first NMOS transistor M1 is grounded, the diode D1 is connected between the source and the drain of the first NMOS transistor M1, and an anode of the diode D1 is grounded.

Optionally, the capacitive unit M0 includes a capacitor; or the capacitive unit M0 includes a PMOS transistor, wherein a gate of the PMOS transistor serves as a first terminal of the capacitive unit M0, and a drain, a source and a substrate of the PMOS transistor are commonly connected as a second terminal of the capacitive unit M0. In this embodiment, according to the working principle of the level conversion unit 111, it can be known that the detection level and the level state of the power supply voltage are opposite.

In one embodiment, the voltage amplitude detection circuit 11 further includes an output unit 113; the output unit 113 is connected to the output terminal of the comparator 112, and is configured to enhance the driving capability of the level signal. In this embodiment, the output unit 113 includes two inverters I1 and I2 connected in series. In other embodiments, the output unit 113 may be an RC circuit.

In one embodiment, the voltage amplitude detection circuit 11 further includes a power-on protection circuit 113, an input terminal of the power-on protection circuit 113 is used to connect a power-on reset signal POR1, and the power-on protection circuit 113 is configured to make the output of the voltage amplitude detection circuit 11 clamp at a high level or a low level under the control of the power-on reset signal POR1. Optionally, the power-on protection circuit 113 includes a first inverter U3 and a second NMOS transistor M2, an input terminal of the first inverter U3 is used as an input terminal of the power-on protection circuit 113, and an output terminal of the first inverter U3 is connected to a gate of the second NMOS transistor M2, a drain of the second NMOS transistor M2 is connected to the output terminal of the comparator 112 or the output terminal of the output unit 113, and a source of the second NMOS transistor M2 is grounded.

Additionally, what is disclosed in FIG. 5 is a general architecture of the comparator 112, in other embodiments, other comparator architectures may be used, which will not be repeated herein again.

Specifically, the power-on reset signal POR1 provides an initial state for the voltage amplitude detection circuit 11 (which may be a chip), and the power-on reset signal POR1 after power on is at a low level, and the power-on reset signal POR1 is at a high level after passing through the inverter I3, the NMOS transistor M2 is turned on and thereby the output of the comparator 112 is forced to be low, the output of the output terminal DOUT is 0, and the chip is in a power-on reset state. After the chip is succeed in power on and reset, the power-on reset signal POR1 is at high and is at low level after passing through the inverter I3, the second NMOS transistor is turned off, the value of the output terminal DOUT is the output value of the comparator 112, and the chip operates normally. The reference voltage VREF is provided by a reference module, for example, 1.2V, and the signal NBIAS is a current source provided by the reference module served as a tail current of the comparator 112. The power supply voltage VCC is input to an N terminal of the comparator 112 (the gate of the NMOS transistor M4) after voltage division by the capacitive unit M0 and the resistive unit (first NMOS transistor M1), and is compared with the reference voltage VREF of the P terminal of the comparator 112 (the gate of the NMOS transistor M5).

After the power supply voltage VCC (such as 5V) is powered on, the capacitive unit M0 is not provided with any charge. The power supply voltage VCC charges the capacitive unit M0 through the NMOS transistor M1, after a certain period of time, the capacitive unit M0 is fully charged and the charging current is equal to zero, and the voltage of the N terminal of the comparator 112 is equal to 0V. When the power supply voltage VCC drops from 5V to 3V, the voltage drop 5V across the capacitive unit M0 cannot be abruptly changed, and the voltage at the N terminal is: 3−5=−2V. Due to the clamping effect of the diode D1, the voltage of the N terminal is −0.7V, the voltage value 1.2V at the P terminal is greater than the voltage value −0.7V at the N terminal and the comparator 112 outputs a high level, and the output terminal DOUT outputs a high level after passing through the two inverters I1 and I2. When the power supply voltage VCC rises from 3V to 5V, the voltage drop −2V across the capacitive unit M0 cannot be abruptly changed, the voltage at the N terminal is: −0.7+2=1.3V, the voltage value 1.2V at the P terminal is less than the voltage value 1.3V at the N terminal, the comparator 112 outputs a low level, and the output terminal DOUT outputs a low level after passing through the two inverters I4 and I3. The detection work of the voltage amplitude detection is repeated in this way, the decoding circuit 12 identifies the DOUT output of the voltage amplitude detection module according to the level signal and duration time thereof, decodes it into corresponding data and stores the corresponding data in a form of a shift register. The decoding circuit 12 may be a mode conversion circuit.

In this embodiment, the format of the data frame signal includes: a control code, first data, second data, third data and a RESET code. In this embodiment, the control code includes a total of 2 bits, which are selection bits of the working mode. The first data, the second data, and the third data are respectively set as 8 bits, C1 C0: 2-bit working mode selection bits, when C1C0=11, the chip turns into a working mode configured to count data frames; when C1C0=01, the chip address matches the count of the data frames and the chip outputs the driving signal. When a full-color LED light is driven, the first data, the second data and the third data respectively represent brightness data information of the LED light provided with three colors. When the control system sends data, it sends the low bit first, then sends the high bit. The control code is sent first, and then the first data, the second data, and the third data are sent in sequence from the low bit to the high bit.

The conversion circuit 135 converts the control signal in the data signal into brightness driving signals provided with different duty ratios. The 8-bit data information represents different values from 0 to 255, and different values correspond to different brightness of the LED light. When the value is 0, the brightness of the LED light is the smallest, and the light is turned off. When the data is 255, the brightness of the LED light is the largest. When the data is a certain value within it, such as 128, the PWM outputs brightness in a duty cycle of 128/256.

The logic control circuit 134 includes a plurality of XNOR gates, C1 and C0 correspond to I56_Q and I52_Q in the shift register, and the XNOR operation is performed on the value of each address of the address setting circuit and the value of each data frame counter in the data frame counting circuit are respectively and then they passes through a matched signal output by the operation. The shift registers of the two control codes are operated by the XNOR gate, When C1C0 is 01, The chip turns into a mode of matching the chip address with the count of the data frames. When C1C0 is 01, an output enabling signal of the logic control circuit 134 is obtained by an AND result of the output obtained from an XNOR gate operation of the shift registers of the two control codes and the matched signal. After an end code RESET is received and at the same time the output enabling signal is 1, the logic control circuit 134 outputs the first data, the second data and the third data in the carrier data to the conversion circuit 135, and updates the output of the driving circuit 136 at the same time; otherwise, the output display is not refreshed.

Please refer to FIG. 6, the present application further discloses an identification method for power-line carrier signals, which includes:

at a step S110, detecting voltage amplitude variation on the power line caused by modulation of data of each of data frames on the power line in a form of a carrier signal as well as duration time, and generating a corresponding level signal;

at a step 120, converting the level signal to obtain data of a current data frame.

In one embodiment, the detecting voltage amplitude variation on the power line caused by modulation of data of each of data frames on the power line in a form of a carrier signal as well as duration time, and generating a corresponding level signal, includes:

detecting the voltage on the power line, and outputting a corresponding level signal according to the peak-to-peak value of the voltage and the duration time, here, a first level signal lasting a second preset duration time is output if the peak-to-peak value is greater than the preset value and the duration time matches a first preset duration time, a second level signal opposite to the level signal and lasting a fourth preset duration time is output if the peak-to-peak value is greater than the preset value and the duration time matches a third preset duration time, and an identification level lasting a sixth preset duration time is output if the peak-to-peak value is greater than the preset value and the duration time matches a fifth preset duration time, the identification level is a first level signal or a second level signal.

In one embodiment, the converting the level signal to obtain data of a current data frame includes:

converting the first level signal lasting the second preset duration time and the second level signal lasting the fourth preset duration time into data 0 and 1 respectively, and converting the identification level lasting the sixth preset duration time into a preset identification code;

here, the data of each data frame includes a control code, control data and a preset identification code arranged in sequence.

Figure 7:
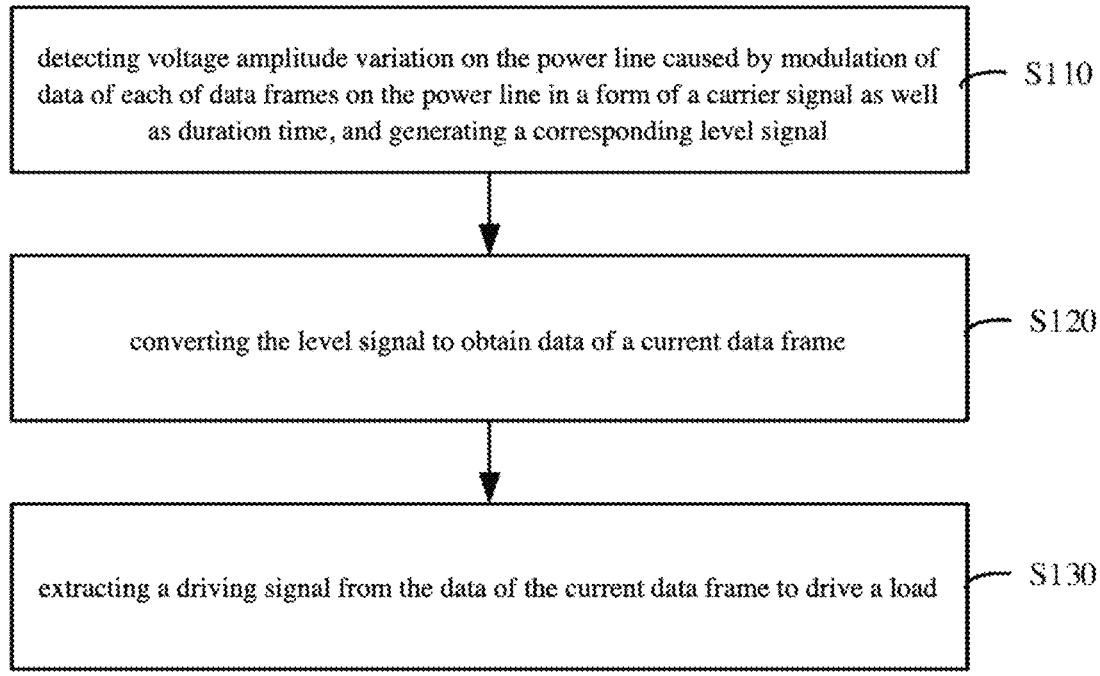
FIG. 7 is a specific flowchart of an identification circuit for power-line carrier signals provided by the second embodiment of the present application.

In one embodiment, please refer to FIG. 7, a step S130 is further included, i.e., extracting a driving signal from the data of the current data frame to drive a load.

In one embodiment, the extracting a driving signal from the data of the current data frame to control a load to work includes:

comparing the address information with a count value of the current data frame, here the count value is counted and added up according to the preset identification code in the data;

extracting control data from the data of the current data frame when the address information matches the count value;

converting the control data into the driving signal and outputting the driving signal to drive the load.

In one embodiment, the method further includes: receiving an initial value setting instruction, and setting an initial value of the count value according to the initial value setting instruction.

Figure 8:
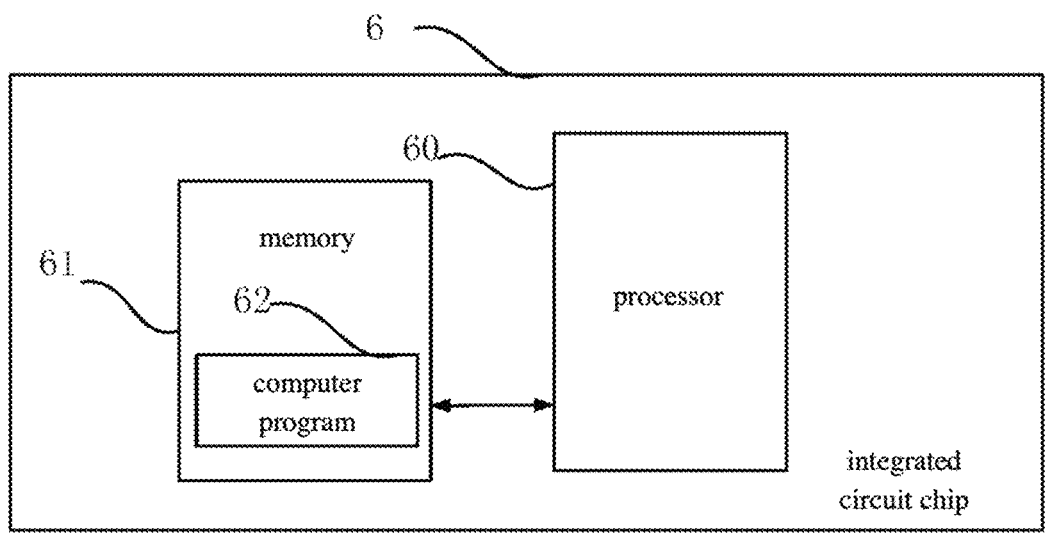
FIG. 8 is a schematic diagram of an integrated circuit chip provided by an embodiment of the present application.

FIG. 8 is a schematic diagram of an integrated circuit chip provided by an embodiment of the present application. As shown in FIG. 8, the integrated circuit chip 6 of this embodiment includes: a processor 60, a memory 61, and a computer program 62 stored in the memory 61 and executable on the processor 60, and the processor 60, when executing the computer program 62, implements the steps in each of the above-mentioned embodiments of the identification method for power-line carrier signals, for example, the steps from 110 to 130 as shown in FIG. 5. Alternatively, the processor 60, when executing the computer program 62, implements the functions of the modules/units in the above-mentioned apparatus embodiments, for example, the functions of the modules as shown in FIG. 2.

Exemplarily, the computer program 62 may be divided into one or more modules/units, and the one or more modules/units are stored in the memory 61 and executed by the processor 60 to complete the present application. The one or more modules/units may be a series of computer program instruction segments capable of performing specific functions, and the instruction segments are used to describe an execution process of the computer program 62 in the integrated circuit chip 6. For example, the computer program 62 may be divided into a synchronization module, an aggregation module, an acquisition module, and a return module (modules in a virtual apparatus), and the specific functions of each module are as follows:

the so-called processor 60 may be a CPU (Central Processing Unit), and may also be other general-purpose processor, DSP (Digital Signal Processors), ASIC (Application Specific Integrated Circuit), FPGA (Field-Programmable Gate Array) or other programmable logic device, discrete gate or transistor logic device, discrete hardware component, and the like. A general-purpose processor may be a microprocessor or the processor may be any conventional processor or the like.

The memory 61 may be an internal storage unit of the integrated circuit chip 6, such as a hard disk or a memory of the integrated circuit chip 6. The memory 61 may also be an external storage device of the integrated circuit chip 6, such as a plug-in hard disk, a SMC (Smart Media Card), an SD (Secure Digital) card, a flash card etc. equipped in the integrated circuit chip 6. Further, the memory 61 may also include both an internal storage unit of the integrated circuit chip 6 and an external storage device. The memory 61 is used to store the computer program and other programs and data required by the integrated circuit chip. The memory 61 may also be used to temporarily store data that has been output or will be output.

The above-mentioned embodiments are only used to illustrate, but not to limit, the technical solutions of the present application; although the present application has been described in detail with reference to the above-mentioned embodiments, those of ordinary skill in the art should understand that: they can still modify the technical solutions described in the foregoing embodiments, or equivalently replace some technical features thereof; and these modifications or replacements do not make the essence of the corresponding technical solutions deviate from the spirit and scope of the technical solutions in the embodiments of the present application, and should be included within the scope of protection of the present application.

What is claimed is:

1. An identification circuit for power-line carrier signals, comprising:

a voltage amplitude detection circuit arranged to connect with a power line and configured to: detect voltage amplitude variation on the power line caused by modulation of data of each of data frames on the power line in a form of a carrier signal as well as duration time, and generate a corresponding level signal;

a decoding circuit connected to the voltage amplitude detection circuit and configured to convert the corresponding level signal to obtain data of a current data frame;

wherein the voltage amplitude detection circuit is specifically configured to:

detect a voltage on the power line, and output the corresponding level signal according to a peak-to-peak value of the voltage and a duration time, wherein:

output a first level signal lasting a second preset duration time if the peak-to-peak value is greater than a preset value and the duration time matches a first preset duration time;

output a second level signal opposite to the first level signal and lasting a fourth preset duration time if the peak-to-peak value is greater than the preset value and the duration time matches a third preset duration time;

output an identification level lasting a sixth preset duration time if the peak-to-peak value is greater than the preset value and the duration time matches a fifth preset duration time, wherein the identification level is the first level signal or the second level signal.

2. The identification circuit for power-line carrier signals of claim 1, wherein the voltage amplitude detection circuit comprises:

a level conversion unit configured to connect to the power line for accessing a voltage signal on the power line and generate a detection level having a preset amplitude according to the voltage signal;

a comparator, one input terminal thereof being connected to the detection level, another input terminal thereof being connected to a reference voltage, wherein the comparator compares the detection level with the reference voltage and outputs a comparison result of the corresponding level signal.

3. The identification circuit for power-line carrier signals of claim 2, wherein the level conversion unit comprises a capacitive unit, a first NMOS transistor and a diode; a gate of the first NMOS transistor is configured to connect to the power line, a drain of the first NMOS transistor is configured as an output of the level conversion unit and is connected to a first terminal of the capacitive unit, a second terminal of the capacitive unit is connected to a power terminal of the comparator, a source of the first NMOS transistor is grounded, the diode is connected between the source and the drain of the first NMOS transistor, and an anode of the diode is grounded.

4. The identification circuit for power-line carrier signals of claim 3, wherein the capacitive unit comprises a capacitor; or the capacitive unit comprises a PMOS transistor, wherein a gate of the PMOS transistor serves as a first terminal of the capacitive unit, and a drain, a source and a substrate of the PMOS transistor are commonly connected as a second terminal of the capacitive unit.

5. The identification circuit for power-line carrier signals of claim 2, wherein the voltage amplitude detection circuit further comprises a power-on protection circuit, an input terminal of the power-on protection circuit is configured to connect a power-on reset signal, and the power-on protection circuit is configured to clamp an output of the voltage amplitude detection circuit at a high level or a low level under control of the power-on reset signal.

6. The identification circuit for power-line carrier signals of claim 5, wherein the power-on protection circuit comprises a first inverter and a second NMOS transistor, an input terminal of the first inverter serves as the input terminal of the power-on protection circuit, an output terminal of the first inverter is connected to a gate of the second NMOS transistor, a drain of the second NMOS transistor is connected to an output terminal of the comparator or an output terminal of an output unit, and a source of the second NMOS transistor is grounded.

7. The identification circuit for power-line carrier signals of claim 1, wherein the decoding circuit converts the first level signal lasting the second preset duration time and the second level signal lasting the fourth preset duration time into data 0 and 1 respectively, and converts the identification level lasting the sixth preset duration time into a preset identification code;

wherein the data of each of the data frames comprises a control code, control data and the preset identification code arranged in sequence.

8. The identification circuit for power-line carrier signals of claim 1, wherein the identification circuit further comprises a control circuit, the control circuit is connected to the decoding circuit and is configured to extract a driving signal from the data of the current data frame to drive a load.

9. The identification circuit for power-line carrier signals of claim 8, wherein the control circuit comprises:

an address setting circuit configured to set address information;

a data frame counting circuit configured to perform counting and statistics according to a preset identification code in the data;

a logic control circuit connected to the address setting circuit, the data frame counting circuit and the load and configured to: compare the address information with a count value of the current data frame, and extract the driving signal from the data of the current data frame to drive the load when the address information matches the count value.

10. The identification circuit for power-line carrier signals of claim 9, wherein the address setting circuit sets the address information through turning on or turning off of a polysilicon fuse inside a chip.

11. The identification circuit for power-line carrier signals of claim 8, wherein a data frame counting circuit is further configured to receive an initial value setting instruction and set an initial value of a count value of a data frame counter of the data frame counting circuit according to the initial value setting instruction.

12. An identification method for power-line carrier signals, comprising:

detecting voltage amplitude variation on a power line caused by modulation of data of each of data frames on the power line in a form of a carrier signal as well as duration time, and generating a corresponding level signal;

converting the corresponding level signal to obtain data of a current data frame, wherein the detecting voltage amplitude variation on the power line caused by modulation of data of each of data frames on the power line in a form of a carrier signal as well as duration time and generating the corresponding level signal comprises:

detecting a voltage on the power line, and outputting the corresponding level signal according to a peak-to-peak value of the voltage and a duration time, wherein:

outputting a first level signal lasting a second preset duration time if the peak-to-peak value is greater than a preset value and the duration time matches a first preset duration time;

outputting a second level signal opposite to the first level signal and lasting a fourth preset duration time if the peak-to-peak value is greater than the preset value and the duration time matches a third preset duration time;

outputting an identification level lasting a sixth preset duration time if the peak-to-peak value is greater than the preset value and the duration time matches a fifth preset duration time, wherein the identification level is the first level signal or the second level signal.

13. The identification method for power-line carrier signals of claim 12, wherein the converting the corresponding level signal to obtain data of the current data frame comprises:

converting the first level signal lasting the second preset duration time and the second level signal lasting the fourth preset duration time into data 0 and 1 respectively, and converting the identification level lasting the sixth preset duration time into a preset identification code;

wherein the data of each of the data frames comprises a control code, control data and the preset identification code arranged in sequence.

14. The identification method for power-line carrier signals of claim 12, wherein the identification method further comprises extracting a driving signal from the data of the current data frame to drive a load.

15. The identification method for power-line carrier signals of claim 14, wherein the extracting a driving signal from the data of the current data frame to drive a load comprises:

comparing address information with a count value of the current data frame, wherein the count value is counted and accumulated according to a preset identification code in the data;

extracting control data from the data of the current data frame when the address information matches the count value;

converting the control data into the driving signal and outputting the driving signal to drive the load.

16. The identification method for power-line carrier signals of claim 15, wherein the identification method further comprises:

receiving an initial value setting instruction and setting an initial value of the count value according to the initial value setting instruction.

17. An integrated circuit chip, comprising a memory, a processor, and a computer program stored in the memory and executable on the processor, wherein the processor, when executing the computer program, implements steps of:

detecting voltage amplitude variation on a power line caused by modulation of data of each of data frames on a power line in a form of a carrier signal as well as duration time, and generating a corresponding level signal;

converting the corresponding level signal to obtain data of a current data frame, wherein the detecting voltage amplitude variation on the power line caused by modulation of data of each of data frames on the power line in a form of a carrier signal as well as duration time and generating the corresponding level signal comprises:

detecting a voltage on the power line, and outputting the corresponding level signal according to a peak-to-peak value of the voltage and a duration time, wherein:

outputting a first level signal lasting a second preset duration time if the peak-to-peak value is greater than a preset value and the duration time matches a first preset duration time;

outputting a second level signal opposite to the first level signal and lasting a fourth preset duration time if the peak-to-peak value is greater than the preset value and the duration time matches a third preset duration time;

outputting an identification level lasting a sixth preset duration time if the peak-to-peak value is greater than the preset value and the duration time matches a fifth preset duration time, wherein the identification level is the first level signal or the second level signal.

* * * * *